United States Patent
Noorbakhsh et al.

(10) Patent No.: US 12,125,688 B2
(45) Date of Patent: *Oct. 22, 2024

(54) L-MOTION SLIT DOOR FOR SUBSTRATE PROCESSING CHAMBER

(71) Applicant: APPLIED MATERIALS, INC., Santa Clara, CA (US)

(72) Inventors: Hamid Noorbakhsh, Oakland, CA (US); James Hugh Rogers, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 713 days.

This patent is subject to a terminal disclaimer.

(21) Appl. No.: 17/183,595

(22) Filed: Feb. 24, 2021

(65) Prior Publication Data

US 2022/0165553 A1      May 26, 2022

Related U.S. Application Data

(60) Provisional application No. 63/116,661, filed on Nov. 20, 2020.

(51) Int. Cl.
*H01J 37/32* (2006.01)

(52) U.S. Cl.
CPC .. *H01J 37/32733* (2013.01); *H01J 37/32467* (2013.01); *H01J 37/32715* (2013.01)

(58) Field of Classification Search
None
See application file for complete search history.

(56) References Cited

U.S. PATENT DOCUMENTS

| | | | |
|---|---|---|---|
| 6,647,918 B1 | 11/2003 | Welch et al. | |
| 10,636,629 B2 | 4/2020 | Noorbakhsh et al. | |
| 11,488,806 B2* | 11/2022 | Noorbakhsh | H01L 21/67742 |
| 2004/0149214 A1* | 8/2004 | Hirose | H01L 21/67126 |
| | | | 118/715 |
| 2009/0028761 A1 | 1/2009 | Devine et al. | |
| 2015/0021324 A1 | 1/2015 | Sun et al. | |
| 2015/0129129 A1 | 5/2015 | Shimizu et al. | |
| 2016/0363240 A1 | 12/2016 | Wagner et al. | |
| 2018/0374722 A1* | 12/2018 | Isago | H01J 37/32458 |
| 2019/0108983 A1 | 4/2019 | Noorbakhsh | |
| 2019/0211936 A1 | 7/2019 | Shimoda et al. | |
| 2021/0351014 A1 | 11/2021 | Noorbakhsh | |
| 2022/0165553 A1* | 5/2022 | Noorbakhsh | H01J 37/32733 |

OTHER PUBLICATIONS

International Search Report for PCT/US2021/060002, dated Mar. 14, 2022.

* cited by examiner

*Primary Examiner* — Sylvia MacArthur
(74) *Attorney, Agent, or Firm* — MOSER TABOA

(57) ABSTRACT

Embodiments of process kits for use in a process chamber are provided herein. In some embodiments, a process kit for use in a process chamber includes a slit door having an arcuate profile and including a first plate slidably coupled to a second plate, wherein the first plate is configured to be coupled to an actuator, wherein the second plate has an inner surface that includes silicon, and wherein the inner surface includes a plurality of grooves.

20 Claims, 4 Drawing Sheets

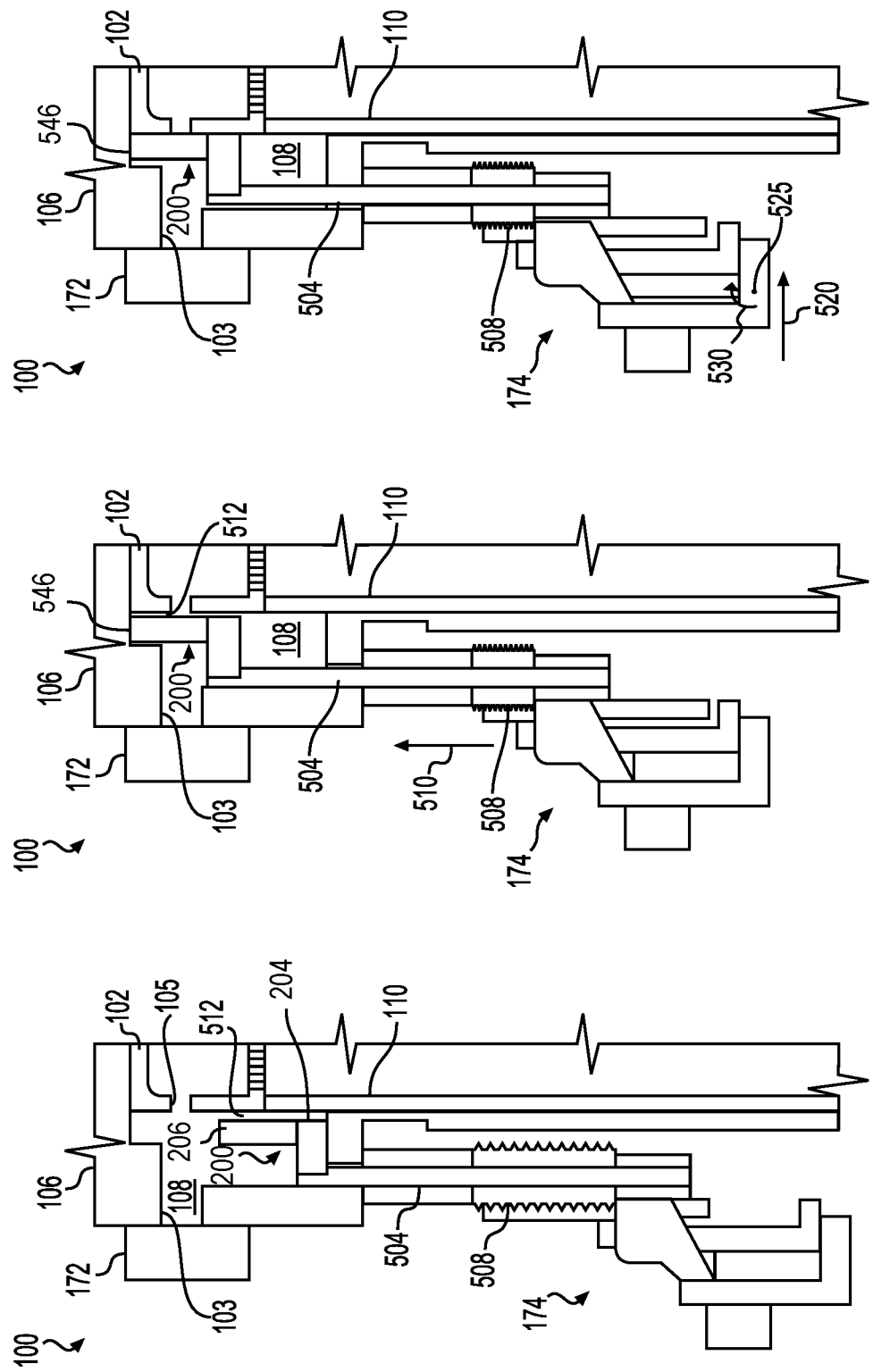

L-MOTION SLIT DOOR FOR SUBSTRATE PROCESSING CHAMBER

CROSS-REFERENCE TO RELATED APPLICATIONS

This application claims benefit of U.S. provisional patent application Ser. No. 63/116,661, filed Nov. 20, 2020 which is herein incorporated by reference in its entirety.

FIELD

Embodiments of the present disclosure generally relate to semiconductor processing equipment, and more specifically, to slit doors for use in semiconductor processing equipment.

BACKGROUND

Deposition and etch chambers used in the manufacturing of semiconductor devices need to produce consistent and uniform results for every substrate that is processed. To further enhance processing, plasma can be used in both deposition and etching of materials. The plasma can be generated through inductive coupling or capacitive coupling. In capacitively coupled plasma chambers, conductance liners are used to contain the plasma generated in a process volume of the chamber and to provide an RF ground return path. The conductance liners generally surround the process volume except where interrupted by substrate transfer slots. The substrate transfer slots allow robotic arms to place substrates into and out of the process volume of the plasma chamber. The inventors have observed, however, that the presence of the transfer slot interferes with the uniformity of the deposition on the substrate during processing.

Thus, the inventors have provided improved methods and apparatus that increase deposition uniformity on substrates.

SUMMARY

Embodiments of process kits for use in a process chamber are provided herein. In some embodiments, a process kit for use in a process chamber includes a slit door having an arcuate profile and including a first plate slidably coupled to a second plate, wherein the first plate is configured to be coupled to an actuator, wherein the second plate has an inner surface that includes silicon, and wherein the inner surface includes a plurality of grooves.

In some embodiments, a slit door assembly for use in a process chamber includes: a process kit having a slit door having an arcuate profile and including a first plate coupled to a second plate, wherein the first plate has one or more legs extending from an outer surface of the first plate, wherein the second plate has an inner surface that includes polysilicon; bumpers disposed in one or more grooves formed on an inner surface of the second plate; and an actuator coupled to the one or more legs of the first plate and configured to move the slit door in a vertical direction and a horizontal direction.

In some embodiments, a process chamber includes: a chamber body defining an interior volume therein, having an opening extending through sidewalls of the chamber body for transferring a substrate, and having a chamber cavity disposed about the opening on an interior surface of the chamber body; a liner disposed in the interior volume and at least partially defining a processing volume therein, wherein the liner includes a substrate transfer slot aligned with the opening of the chamber body; a slit door having an arcuate profile disposed in the chamber cavity adjacent to the substrate transfer slot, wherein the slit door includes bumpers on an inner surface of the slit door; an actuator coupled to the slit door and configured to move the slit door in both a vertical direction and a horizontal direction to selectively cover or expose the substrate transfer slot of the liner; and a substrate support disposed in the interior volume to support a substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 5A depicts a schematic side view of a slit door in a first position in accordance with some embodiments of the present disclosure.

FIG. 5B depicts a schematic side view of a slit door in a second position in accordance with some embodiments of the present disclosure.

FIG. 5C depicts a schematic side view of a slit door in a third position in accordance with some embodiments of the present disclosure.

Figure 1:
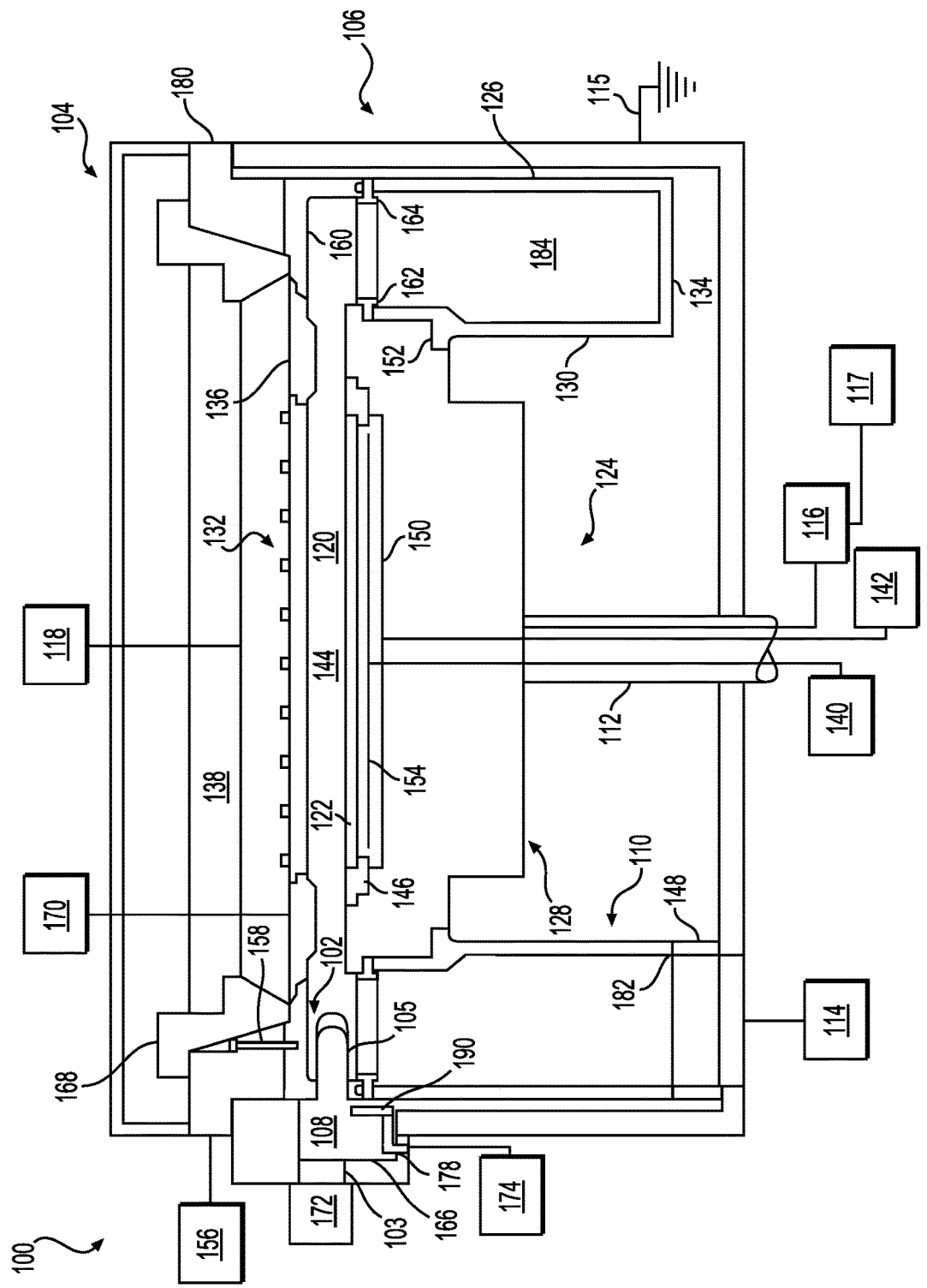
FIG. 1 depicts a schematic side view of a portion of a process chamber having a slit door in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The apparatus described herein provides improved deposition uniformity in plasma process chambers. Plasma confinement liners facilitate in keeping the plasma within a process chamber's process volume and provide an RF ground return path during processing. The inventors have discovered that substrate transfer slots used for placing substrates into and out of the process volume of the process chamber are a major source of uniformity issues as the substrate transfer slot breaches the confinement liner. The substrate transfer slot disrupts the smoothness of the inner surface of the confinement liner and affects the current flow through the confinement liner. Embodiments of slit doors provided herein advantageously selectively cover substrate transfer slots of confinement liners disposed in a process chamber to improve the uniformity of the deposition on the substrate during processing. By selectively covering the substrate transfer slot, the slit door closes a gap between the slit door and the confinement liner, reducing or preventing plasma light up therebetween.

In some embodiments, the slit door includes bumpers that protrude from an inner surface of the slit door to advantageously provide RF coupling between the slit door and the confinement liner while also maintaining a small gap (about 0.005 inches to about 0.025 inches) between a remainder of the slit door and the confinement liner to reduce unwanted particle generation. In some embodiments, the slit door is made of a same material as the confinement liner to advantageously provide electrical continuity across the substrate transfer slot. The slit door moves in an L-motion to reduce or prevent generation of unwanted particles through rubbing of chamber components.

FIG. 1 is a schematic side view of a portion of a process chamber having a slit door in accordance with some embodiments of the present disclosure. In some embodiments, the process chamber is an etch processing chamber. However, other types of processing chambers configured for different processes can also use or be modified for use with embodiments of the liners described herein.

The process chamber 100 is a vacuum chamber which is suitably adapted to maintain sub-atmospheric pressures within an interior volume 120 during substrate processing. The process chamber 100 includes a chamber body 106 having sidewalls and a bottom wall. The chamber body 106 is covered by a lid 104 and the chamber body 106 and the lid 104, together, define the interior volume 120. The chamber body 106 and lid 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise a pedestal 128 and a hollow support shaft 112 for supporting the pedestal 128. The pedestal 128 may include an electrostatic chuck 150. The electrostatic chuck 150 comprises a dielectric plate having one or more electrodes 154 disposed therein. The hollow support shaft 112 provides a conduit to provide, for example, backside gases, process gases, fluids, coolants, power, or the like, to the pedestal 128.

The substrate support 124 is coupled to a chucking power supply 140 and RF sources (e.g., RF bias power supply 117 or RF plasma power supply 170) to the electrostatic chuck 150. In some embodiments, a backside gas supply 142 is disposed outside of the chamber body 106 and supplies heat transfer gas to the electrostatic chuck 150. In some embodiments, the RF bias power supply 117 is coupled to the electrostatic chuck 150 via one or more RF match networks 116. In some embodiments, the substrate support 124 may alternatively include AC or DC bias power.

The process chamber 100 is also coupled to and in fluid communication with a process gas supply 118 which may supply one or more process gases to the process chamber 100 for processing the substrate 122 disposed therein. In some embodiments, a showerhead 132 is disposed in the interior volume 120 opposite the substrate support 124. In some embodiments, the showerhead 132 is coupled to the lid 104. The showerhead 132 and the substrate support 124 partially define a processing volume 144 therebetween. The showerhead 132 includes a plurality of openings to distribute the one or more process gases from the process gas supply 118 into the processing volume 144. The showerhead 132 may be coupled to a temperature control unit 138 to control a temperature of the showerhead 132. In some embodiments, an upper electrode 136 is disposed in the interior volume 120 opposite the substrate support 124 to further define the process volume 144. The upper electrode 136 is coupled to one or more power sources (e.g., RF plasma power supply 170) to ignite the one or more process gases. In some embodiments, the upper electrode 136 comprises silicon.

The process chamber 100 generally includes a process kit to protect chamber components against unwanted deposition or etching. The process kit may include a liner 102, for example a confinement liner, disposed in the interior volume 120 about at least one of the substrate support 124 and the showerhead 132 to confine a plasma therein. In some embodiments, the liner 102 is made of a suitable process material, such as aluminum or a silicon-containing material. For example, the liner 102 may be made of silicon carbide (SiC), single crystal silicon, polysilicon, or a material coated with silicon carbide (SiC) or polysilicon to advantageously reduce contamination on the substrate 122. The liner 102 includes an upper liner 160 and a lower liner 162.

The upper liner 160 may be made of any of the materials mentioned above. In some embodiments, the lower liner 162 is made of the same material as the upper liner 160. For example, the upper liner 160 and the lower liner 162 may both be made of polysilicon. In some embodiments, the upper liner 160 is made of a material different than the lower liner 162. For example, in some embodiments, the upper liner 160 is made of aluminum and the lower liner 162 is made of polysilicon or a material coated with polysilicon. In some embodiments, the upper liner 160 is made of silicon carbide (SiC) and the lower liner 162 is made of polysilicon or a material coated with polysilicon. In some embodiments, the upper liner 160 rests on the lower liner 162. In some embodiments, the upper liner 160 and the lower liner 162 are integrally formed. The lower liner 162 extends radially inward from the upper liner 160 to define a C-shaped cross-sectional profile of the liner 102. In some embodiments, an inner diameter of the upper liner 160 is greater than an inner diameter of the lower liner 162.

The lower liner 162 includes a plurality of radial slots 164 arranged around the lower liner 162 to provide a flow path of the process gases to a pump port 148 (discussed below). In some embodiments, the liner 102, along with the showerhead 132 and the pedestal 128, at least partially define the processing volume 144. In some embodiments, an outer diameter of the showerhead 132 is less than an outer diameter of the liner 102 and greater than an inner diameter of the liner 102. The liner 102 includes a substrate transfer slot 105 aligned with an opening 103 in the chamber body 106 for transferring the substrate 122 into and out of the process chamber 100. In some embodiments, the opening 103 has a width of about 13 inches to about 22 inches. A slit valve 172 is coupled to the chamber body 106 to selectively open or close the opening 103 in the chamber body 106.

The process kit includes a slit door 190 disposed between the chamber body 106 and the liner 102. In some embodiments, the chamber body 106 includes a chamber cavity 108 disposed about the opening 103 on an interior surface 166 of the chamber body 106. In some embodiments, the slit door 190 is disposed in the chamber cavity 108 and is configured to move within the chamber cavity 108 to selectively expose or cover substrate transfer slot 105 of the liner 102. The slit door 190 is shaped corresponding to a shape of the liner 102. In some embodiments, the slit door 190 has an arcuate profile corresponding to a curvature of the liner 102. In a first position, as shown in FIG. 1, the slit door 190 is positioned to expose the substrate transfer slot 105 of the liner.

The process chamber 100 includes a slit door assembly comprising the slit door 190 coupled to an actuator 174 to facilitate moving the slit door 190 from the first position to a subsequent position to selectively cover or seal the substrate transfer slot 105. In some embodiments, the actuator 174 is configured to move the slit door 190 vertically. In some embodiments, the actuator 174 is configured to move the slit door 190 vertically and horizontally, for example, in an L-motion. In some embodiments, the actuator 174 extends through a ledge 178 of the chamber body 106 defined by the chamber cavity 108.

In some embodiments, the liner 102 is coupled to a heater ring 180 to heat the liner 102 to a predetermined temperature. In some embodiments, the liner 102 is coupled to the heater ring 180 via one or more fasteners 158. A heater power source 156 is coupled to one or more heating elements in the heater ring 180 to heat the heater ring 180 and the liner 102. In some embodiments, a ceramic ring 168 is disposed between the heater ring 180 and the showerhead 132 to thermally de-couple the heater ring 180 from the showerhead 132.

The process chamber 100 is coupled to and in fluid communication with a vacuum system 114, which includes a throttle valve and a vacuum pump, used to exhaust the process chamber 100. The pressure inside the process chamber 100 may be regulated by adjusting the throttle valve and/or vacuum pump. The vacuum system 114 may be coupled to a pump port 148.

In some embodiments, the liner 102 rests on a lower tray 110. The lower tray 110 is configured to direct a flow of the one or more process gases and processing by-products from the plurality of radial slots 164 to the pump port 148. In some embodiments, the lower tray 110 includes an outer sidewall 126, an inner sidewall 130, and a lower wall 134 extending from the outer sidewall 126 to the inner sidewall 130. The outer sidewall 126, the inner sidewall 130, and the lower wall 134 define an exhaust volume 184 therebetween. In some embodiments, the outer sidewall 126 and the inner sidewall 130 are annular. The lower wall 134 includes one or more openings 182 (one shown in FIG. 1) to fluidly couple the exhaust volume 184 to the vacuum system 114. The lower tray 110 may rest on or be otherwise coupled to the pump port 148. In some embodiments, the lower tray 110 includes a ledge 152 extending radially inward from the inner sidewall 130 to accommodate a chamber component, for example, the pedestal 128 of the substrate support 124. In some embodiments, the lower tray 110 is made of a conductive material such as aluminum to provide a ground path.

In operation, for example, a plasma may be created in the processing volume 144 to perform one or more processes. The plasma may be created by coupling power from a plasma power source (e.g., RF plasma power supply 170) to a process gas via one or more electrodes (e.g., upper electrode 136) near or within the interior volume 120 to ignite the process gas and create the plasma. A bias power may also be provided from a bias power supply (e.g., RF bias power supply 117) to the one or more electrodes 154 within the electrostatic chuck 150 to attract ions from the plasma towards the substrate 122.

A plasma sheath can bend at an edge of the substrate 122 causing ions to accelerate perpendicularly to the plasma sheath. The ions can be focused or deflected at the substrate edge by the bend in the plasma sheath. In some embodiments, the substrate support 124 includes an edge ring 146 disposed about the electrostatic chuck 150. In some embodiments, the edge ring 146 and the electrostatic chuck 150 define a substrate receiving surface. The edge ring 146 may be coupled to a power source, such as RF bias power supply 117 or a second RF bias power supply (not shown) to control and/or reduce the bend of the plasma sheath.

Figure 2:
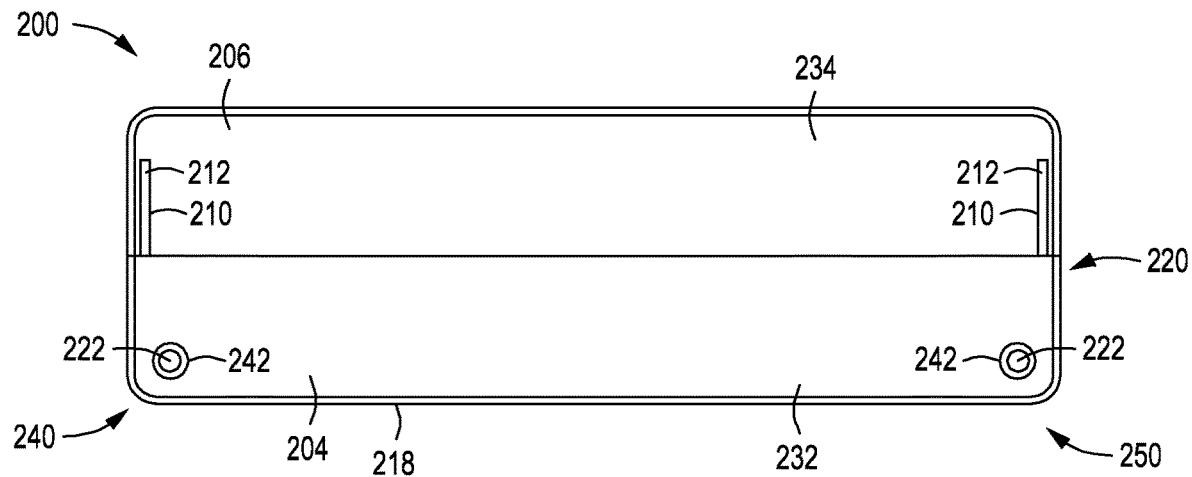
FIG. 2 depicts a front view of a slit door in accordance with some embodiments of the present disclosure.
Figure 3:
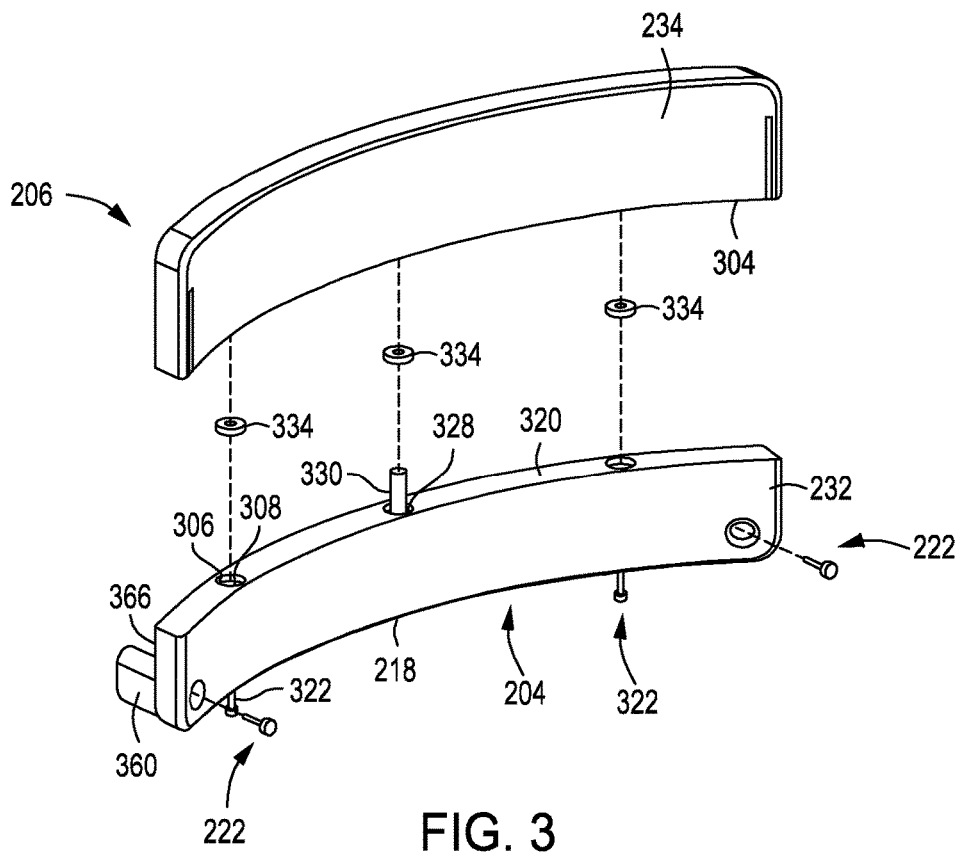
FIG. 3 depicts an exploded isometric view of a slit door in accordance with some embodiments of the present disclosure.

FIG. 2 depicts a front view of a slit door 200 in accordance with some embodiments of the present disclosure. FIG. 3 depicts an exploded isometric view of a slit door in accordance with some embodiments of the present disclosure. In some embodiments, the slit door 200 is the slit door 190 of FIG. 1. In some embodiments, the slit door 200 includes a second plate 206 disposed on a first plate 204 and slidably coupled to the first plate 204. In some embodiments, the first plate 204 and the second plate 206 are curved. In some embodiments, a top surface 320 of the first plate 204 has a profile similar to a profile of a lower surface 304 of the second plate 206 so that an inner surface 232 of the first plate 204 corresponds with an inner surface 234 of the second plate 206. In some embodiments, the inner surface 232 of the first plate 204 is slightly recessed from the inner surface 234 of the second plate 206 so that the inner surface 234 of the second plate prevents the inner surface 232 of the first plate 204 from contacting the liner 102, advantageously reducing particle formation. In some embodiments, the second plate 206 has no through holes.

In some embodiments, the inner surface 232 of the second plate 206 includes a plurality of grooves 210 to accommodate bumpers 212 disposed therein. In some embodiments, the bumpers 212 are made of a conductive material. In some embodiments, the bumpers 212 are made of an insulative material. In some embodiments, the bumpers 212 are made of a polymer, for example, polytetrafluoroethylene (PTFE). The bumpers 212 provide a contact surface against the liner 102. The bumpers 212 protrude out from the inner surface 234 of the second plate 206 to provide a gap between the second plate 206 and the liner 102 to advantageously reduce particle generation. In some embodiments, the gap between the second plate 206 and the liner 102 is about 0.005 inches to about 0.025 inches (i.e., bumpers 212 protrude about 0.005 inches to about 0.025 inches) to advantageously maintain uniform RF coupling between the slit door 200 and the liner 102. In some embodiments, the bumpers 212 have a width of about 0.05 inches to about 0.20 inches.

The slit door 200 has a first side 240 and a second side 250 opposite the first side 240. In some embodiments, the plurality of grooves 210 comprise one or more grooves proximate the first side 240 and one or more grooves proximate the second side 250. In some embodiments, proximate the first side 240 and proximate the second side 250 is about 1 inch or less. In some embodiments, the plurality of grooves 210 extend vertically upward from the lower surface 304 of the second plate 206. The plurality of grooves 210 are disposed outside of a region of the second plate 206 corresponding with the substrate transfer slot 105 so that the bumpers 212 are not in a line of sight from the processing volume 144.

In some embodiments, the first plate 204 is made of metal such as aluminum. In some embodiments, the second plate 206 is made of a material having silicon, for example, polysilicon, silicon carbide (SiC), or a material coated with polysilicon or silicon carbide (SiC). In some embodiments, a height of the second plate 206 is greater than a height of the first plate 204. The second plate 206 is sized so that the height is greater than a height of the substrate transfer slot 105. In some embodiments, the height of the second plate 206 is about 2 inches to about 3 inches. In some embodiments, the height of the first plate is about 0.5 inches to about 2 inches. In some embodiments, a height of the slit door 200 is about 3 inches to about 4 inches.

In some embodiments, the first plate 204 can advantageously slide, or float, with respect to the second plate 206 while being coupled thereto to self-align to an outer surface of the liner 102. In some embodiments, the first plate 204 includes holes 308 extending from a lower surface 218 to a top surface 320 thereof. The first plate 204 may be coupled to the second plate 206 via fasteners 322 extending through the holes 308 into openings 406 (see FIG. 4A and 4B) disposed in the second plate 206. A diameter of the holes 308 may be larger than an outer diameter of the fasteners 322 so that the fasteners 322 can move in the holes 308 to facilitate sliding of the second plate 206 with respect to the first plate 204. In some embodiments, the second plate 206 may be about 0.02 inches to about 0.2 inches wider than the first plate 204 so that the first plate 204 does not extend past the second plate 206 at either the first side 240 of the second side 250 of the slit door 200 when the second plate 206 slides with respect to the first plate 204.

In some embodiments, washers 334 are disposed between the first plate 204 and the second plate 206. In some embodiments, as shown in FIG. 3, each of the holes 308 of the first plate 204 include a counterbore 306 at the top surface 320 to accommodate one of the washers 334. In some embodiments, as shown in 4A, the washers 334 may be disposed in a counterbore 414 of the second plate 206. In some embodiments, the washers 334 may be disposed in both counterbore 414 and counterbore 306. In some embodiments, the first plate 204 includes a pivot pin 330 that extends upward from the top surface 320 of the first plate 204. In some embodiments, the first plate 204 is slidably coupled to the second plate 206 via the pivot pin 330 and fasteners 322. In some embodiments, the fasteners 322 comprise two fasteners and the pivot pin 330 is disposed between the two fasteners. The pivot pin 330 extends into a corresponding pin opening of the second plate 206.

In some embodiments, at least one of the first plate 204 and the second plate 206 are counterbored to accommodate one of the washers 334 about the pivot pin 330. For example, as shown in FIG. 3, the first plate 204 includes a counterbore 328 about the pivot pin 330 to accommodate one of the washers 334. The counterbore 306 and the counterbore 328 have diameters that are larger than the washers 334 to allow the washers 334 to slide, or translate, therein. In some embodiments, the counterbore 306 and the counterbore 328 have a diameter that is about 0.01 inches to about 0.10 inches larger than an outer diameter of the washers 334. The washers 334 may be made of a metal, such as aluminum or stainless steel. In some embodiments, the second plate 206 includes a counterbore similar to counterbore 328 in shape and size to accommodate one of the washers 334 and the first plate 204 does not have the counterbore 328.

In some embodiments, the washers 334 protrude slightly from the top surface 320 of the first plate 204 to form a gap 220 between the first plate 204 and the second plate 206. In some embodiments, the gap 220 is about 0.005 inches to about 0.02 inches. The gap 220 advantageously allows the washers 334 to be used as low friction sliding surfaces, leading to reduced particle formation when the first plate 204 slides with respect to the second plate 206. The gap 220 also advantageously reduces heat transfer from the second plate 206 to the first plate 204 so that the second plate 206 may be passively heated via plasma from the processing volume 144 during use.

In some embodiments, one or more legs 360 extend from an outer surface 366 of the first plate 204. The one or more legs 360 (one shown and one hidden in FIG. 3) are configured to couple the first plate 204 to the actuator 174. In some embodiments, the first plate 204 includes an opening 242 from the inner surface 232 of the first plate 204 through each of the one or more legs 360 to accommodate a fastener 222 for coupling the first plate 204 to the actuator 174. In some embodiments, a spring is disposed about the fastener 222 to create a fastener 222 that is spring-loaded to facilitate better contact between the slit door 200 and the liner 102 when in the third position (e.g., FIG. 5C below). In some embodiments, the one or more legs 260 comprises two legs and the first plate 204 is coupled to the second plate 206 via two holes 308 disposed between the two legs. In some embodiments, each opening 242 for the one or more legs 360 is disposed between proximate ones of the bumpers 212 and the holes 308.

Figure 4A:
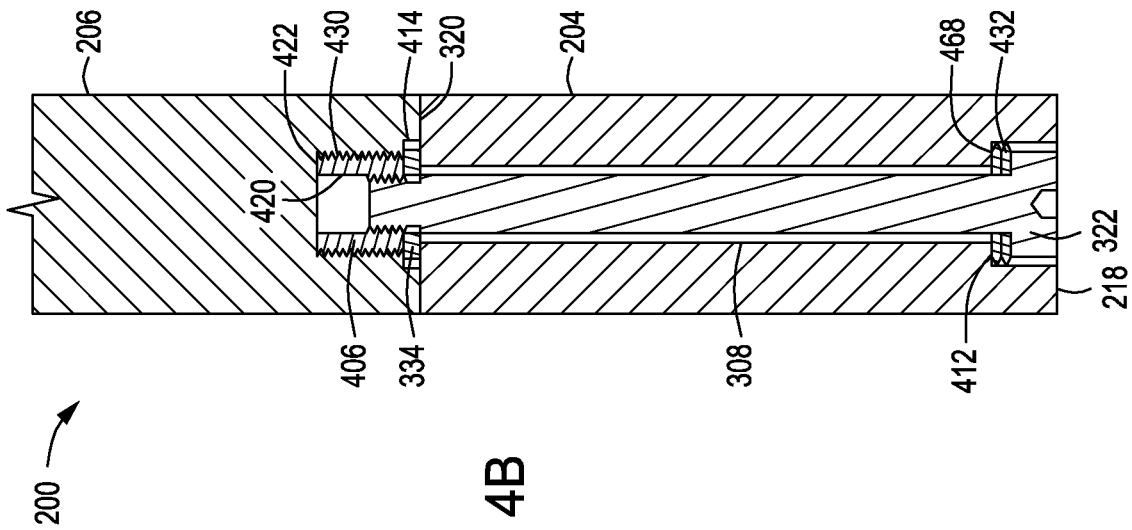
FIG. 4A depicts a cross-sectional side view of a slit door in accordance with some embodiments of the present disclosure.

FIG. 4A depicts a cross-sectional side view of a slit door 200 in accordance with some embodiments of the present disclosure. In some embodiments, an insert 422 is disposed in each of the openings 406 in the second plate 206 to protect a structural integrity of the second plate 206. The insert 422 may be threaded into, press fit, or otherwise secured within the openings 406 in the second plate 206. For example, the openings 406 may be threaded to receive and outer surface 430 of the insert 422 that is threaded. In some embodiments, the insert 422 includes a threaded central opening 420 to receive the fasteners 322. The insert 422 may be made of a polymer material, for example, a thermoplastic such as polyether ether ketone or polyamide-imides.

In some embodiments, the fasteners 322 are shoulder screws. In some embodiments, a diameter of the fasteners are about 0.1 inches to about 0.3 inches. In some embodiments, the first plate 204 includes a counterbore 412 about the holes 308 at the lower surface 218. In some embodiments, the fasteners 322 are disposed in the counterbore 412 so that the fastener head is not exposed outside of the counterbore 412. In some embodiments, the openings 406 of the second plate 206 include a counterbore 414 In some embodiments, as shown in FIG. 4A, the openings 406 of the second plate 206 include a counterbore 414 for accommodating washers 334 therein. The counterbore 414 may be similar in size and shape as discussed above with respect to counterbore 306 and counterbore 328.

In some embodiments, the holes 308 in the first plate 204 have a counterbore 418 at the top surface 320 to accommodate a biasing element 416, such as a spring. In some embodiments, the counterbore 418 is deeper than the counterbore 306. The biasing element 416 is configured to bias one of the washers 334 disposed between the first plate 204 and the second plate 206 against a shoulder 426 defined by the counterbore 418 to pull the insert 422 towards the first plate 204.

Figure 4B:
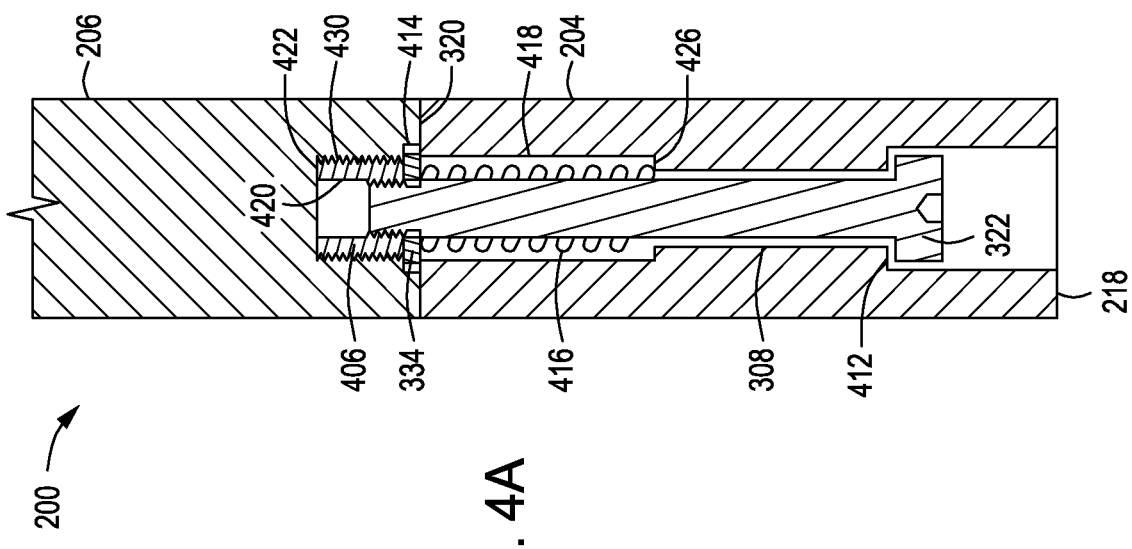
FIG. 4B depicts a cross-sectional side view of a slit door in accordance with some embodiments of the present disclosure.

FIG. 4B depicts a cross-sectional side view of a slit door in accordance with some embodiments of the present disclosure. In some embodiments, as shown in FIG. 4B, the fasteners 322 that couple the first plate 204 to the second plate 206 are captive screws. In some embodiments, the holes 308 have a substantially uniform diameter except for the counterbore 412 at the lower surface 218. In some embodiments, the slit door 200 includes one or more spring washers 432 (two shown) disposed between a head of the fastener 322 and a shoulder 468 defined by the counterbore 412. The spring washers 432 are configured to pull the insert 422 towards the first plate 204.

FIG. 5A is a schematic side view of a slit door in a first position in accordance with some embodiments of the present disclosure. The slit door may be slit door 190 or slit door 200, as shown in FIG. 5A. The slit door 200 advantageously has minimal moving parts within the chamber cavity 108, thereby reducing the generation of unwanted particles. In the first position, the slit door 200 is disposed below the substrate transfer slot 105, exposing the substrate transfer slot 105 to the opening in the chamber body 106. In the first position, there is a gap 512 between the slit door 400 and the liner 102. In some embodiments, the gap 512 is about 0.02 inches to about 0.2 inches. In some embodiments, the actuator 174 includes having one or more shafts 504 and a bellows 508 disposed about each shaft 504 to facilitate moving the shaft 504 in a vertical direction 510. In some embodiments, the one or more shafts 504 are two shafts. In some embodiments, the actuator 174 includes a double acting air cylinder capable of moving the one or more shafts 504 in unison in both a vertical direction and a horizontal direction.

FIG. 5B is a schematic side view of the slit door 200 in a second position in accordance with some embodiments of the present disclosure. The gap 512 between the slit door 200 and the liner 102 is substantially maintained while the slit door 200 moves from the first position to the second position, advantageously preventing the slit door 200 from rubbing against the liner 102 and generating unwanted particles. In some embodiments, in the second position, the slit door 200 contacts a chamber ceiling 546. In some embodiments, from the first position to the second position, the slit door 200 moves towards the chamber ceiling 546 without contacting the chamber ceiling 546. In some embodiments, slit door 200 is configured to move a vertical distance of about 2.5 inches to about 3.5 inches from the first position to the second position.

FIG. 5C is a schematic side view of the slit door 400 in a third position in accordance with some embodiments of the present disclosure. From the second position to the third position, the actuator 174 moves the one or more shafts 504, and the slit door 200 coupled thereto, in a horizontal direction 520 towards the liner 102. In some embodiments, the actuator 174 is configured to move the slit door 200 laterally in the horizontal direction 520. In some embodiments, the actuator 174 is configured to pivot about a pivot axis 525 in a rotational direction 530 to move the slit door 200 in the horizontal direction 520. In some embodiments, the pivot axis 525 is disposed at a lower portion of the actuator 174. In some embodiments, the slit door 200 is configured to move a horizontal distance of about 0.1 inches to about 0.2 inches to close the gap 512 so that the bumpers 212 engage the liner 102, while maintaining a small gap (about 0.005 inches to about 0.025 inches) between the liner 102 and the second plate 206. In some embodiments, the springs disposed about the fasteners 222 urge the slit door 200 against the liner 102 to provide better engagement between the bumpers 212 of the slit door 200 and the liner 102 when in the third position.

While the foregoing is directed to embodiments of the present disclosure, other and further embodiments of the disclosure may be devised without departing from the basic scope thereof.

The invention claimed is:

1. A process kit for use in a process chamber, comprising:
a slit door having an arcuate profile and including a first plate slidably coupled to a second plate, wherein the first plate is configured to be coupled to an actuator, wherein the second plate has an inner surface that includes silicon, and wherein the inner surface includes a plurality of grooves.

2. The process kit of claim 1, wherein the second plate is disposed on the first plate and coupled to the first plate via fasteners extending through the first plate and into openings in the second plate.

3. The process kit of claim 2, wherein the fasteners comprise two fasteners and a pivot pin is disposed between the two fasteners and extends upward from a top surface of the first plate.

4. The process kit of claim 2, further comprising an insert disposed in each of the openings in the second plate, wherein the insert includes a threaded central opening to receive the fasteners.

5. The process kit of claim 1, wherein one or more legs extend from an outer surface of the first plate, and the first plate includes an opening from an inner surface of the first plate through each of the one or more legs to accommodate a fastener for coupling the first plate to the actuator.

6. The process kit of claim 1, wherein the second plate is entirely made of polysilicon or silicon carbide (SIC).

7. The process kit of claim 1, further comprising bumpers disposed in the plurality of grooves, wherein the bumpers protrude from the inner surface of the second plate.

8. The process kit of claim 7, wherein the bumpers are made of a conductive material or an insulative material.

9. The process kit of claim 1, further comprising washers disposed between the first plate and the second plate to provide a gap between the first plate and the second plate.

10. A process chamber, comprising:
a chamber body defining an interior volume therein, having an opening extending through sidewalls of the chamber body for transferring a substrate, and having a chamber cavity disposed about the opening on an interior surface of the chamber body;
a liner disposed in the interior volume and at least partially defining a processing volume therein, wherein the liner includes a substrate transfer slot aligned with the opening of the chamber body;
the slit door of claim 1 disposed in the chamber cavity adjacent to the substrate transfer slot;
an actuator coupled to the slit door and configured to move the slit door in both a vertical direction and a horizontal direction to selectively cover or expose the substrate transfer slot of the liner; and
a substrate support disposed in the interior volume to support a substrate.

11. The process chamber of claim 10, wherein bumpers are disposed in the plurality of grooves of the second plate.

12. The process chamber of claim 10, wherein the actuator extends through a ledge in the chamber body.

13. The process chamber of claim 12, wherein the substrate transfer slot has a width of about 13 inches to about 22 inches.

14. The process chamber of claim 10, wherein the liner has a C-shaped cross-sectional profile.

15. The process chamber of claim 10, wherein the slit door is configured to move a horizontal distance of about 0.1 inches to about 0.2 inches and a vertical distance of about 2.5 inches to about 3.5 inches.

16. A slit door assembly for use in a process chamber, comprising:
a process kit having a slit door having an arcuate profile and including a first plate coupled to a second plate, wherein the first plate has one or more legs extending from an outer surface of the first plate, wherein the second plate has an inner surface that includes polysilicon;

bumpers disposed in one or more grooves formed on an inner surface of the second plate; and an actuator coupled to the one or more legs of the first plate and configured to move the slit door in a vertical direction and a horizontal direction.

17. The slit door assembly of claim 16, wherein the second plate is disposed on the first plate and coupled to the first plate via fasteners extending through the first plate and into openings in the second plate, and wherein an insert made of a polymer is disposed in each of the openings in the second plate, wherein the insert includes a threaded central opening to receive the fasteners.

18. The slit door assembly of claim 16, wherein the first plate is made of aluminum and the second plate is made of polysilicon, silicon carbide (SiC), or a material coated with polysilicon or silicon carbide (SiC).

19. The slit door assembly of claim 16, wherein the actuator includes a double acting air cylinder capable of moving the slit door in both a vertical direction and a horizontal direction.

20. The slit door assembly of claim 16, wherein the actuator is configured to pivot about a pivot axis to move the slit door in the horizontal direction.

* * * * *